(12) United States Patent
Bruno

(10) Patent No.: US 8,193,635 B2
(45) Date of Patent: *Jun. 5, 2012

(54) INTEGRATED CIRCUIT HAVING MEMORY AND ROUTER DISPOSED THEREON AND METHOD OF MAKING THEREOF

(75) Inventor: John Bruno, Scarborough (CA)

(73) Assignee: ATI Technologies ULC, Markham, Ontario (CA)

( * ) Notice: Subject to any disclaimer, the term of this patent is extended or adjusted under 35 U.S.C. 154(b) by 1012 days.

This patent is subject to a terminal disclaimer.

(21) Appl. No.: 11/383,343

(22) Filed: May 15, 2006

(65) Prior Publication Data

US 2006/0197221 A1  Sep. 7, 2006

Related U.S. Application Data

(63) Continuation of application No. 10/064,856, filed on Aug. 23, 2002, now Pat. No. 7,112,884.

(51) Int. Cl.
*H01L 23/24* (2006.01)
*G06F 3/00* (2006.01)
*G06F 13/00* (2006.01)

(52) U.S. Cl. .......................... 257/724; 710/8; 710/104

(58) Field of Classification Search ............... 257/724, 257/686, 774, 778, 731, 736; 710/8, 104
See application file for complete search history.

(56) References Cited

U.S. PATENT DOCUMENTS

| | | | |
|---|---|---|---|
| 4,456,712 A * | 6/1984 | Christie et al. | 523/439 |
| 6,243,817 B1 * | 6/2001 | Melo et al. | 713/300 |
| 6,251,695 B1 | 6/2001 | Kwon | |
| 6,266,753 B1 * | 7/2001 | Hicok et al. | 711/202 |
| 6,335,565 B1 * | 1/2002 | Miyamoto et al. | 257/686 |
| 6,345,350 B2 * | 2/2002 | Maruyama et al. | 711/202 |
| 6,346,946 B1 | 2/2002 | Jeddeloh | |
| 6,442,666 B1 * | 8/2002 | Stracovsky | 711/206 |
| 6,617,673 B2 | 9/2003 | Lee | |
| 6,683,615 B1 * | 1/2004 | Baldwin | 345/543 |
| 6,744,438 B1 * | 6/2004 | Baldwin | 345/552 |
| 6,772,315 B1 * | 8/2004 | Perego | 711/207 |
| 6,886,090 B1 * | 4/2005 | Campbell | 711/206 |
| 2002/0133742 A1 * | 9/2002 | Hsu et al. | 714/8 |
| 2003/0015792 A1 * | 1/2003 | Urakawa | 257/724 |
| 2003/0038824 A1 | 2/2003 | Ryder | |
| 2003/0183934 A1 | 10/2003 | Barrett | |
| 2004/0256722 A1 | 12/2004 | Tandy | |

FOREIGN PATENT DOCUMENTS

WO  WO 9825304 A1 *  6/1998

* cited by examiner

*Primary Examiner* — Wael Fahmy
*Assistant Examiner* — Diana C Vieira
(74) *Attorney, Agent, or Firm* — Faegre Baker Daniels LLP

(57) ABSTRACT

An integrated circuit having memory disposed thereon and method of making thereof includes a standard dimension carrier substrate and an information router integrated on the carrier substrate. Further included therein is at least one system memory integrated on the carrier substrate and in electrical communication with the information router across at least one of the electrical leads associated with the carrier substrate. Thereupon, system instructions may be stored and retrieved from the system memory through the information router within the integrated circuit on the standard dimension carrier substrate.

21 Claims, 5 Drawing Sheets ial. And, among other things, having the DIMM 102 externally connected to the north bridge 100 reduces overall system speed as the system information must be transmitted across the external connections 104, thereby increasing processing times and reducing overall system efficiency.

INTEGRATED CIRCUIT HAVING MEMORY AND ROUTER DISPOSED THEREON AND METHOD OF MAKING THEREOF

RELATED CO-PENDING APPLICATION

This application is a continuation of U.S. application Ser. No. 10/064,856 filed Aug. 23, 2002, now U.S. Pat. No. 7,112,884 entitled "Integrated Circuit Having Memory Disposed Thereon and Method of Making Thereof," having as an inventor John Bruno, and owned by instant assignee.

FIELD OF THE DISCLOSURE

The present invention relates generally to an apparatus for data processing and more specifically to an integrated circuit having system memory disposed thereon.

BACKGROUND

A typical computing system is composed of multiple processors and various memory components which may be in electrical communication with each other using different forms of intermediate mediums for interconnecting the components. One common processing system includes a central processing unit (CPU) which interacts with various components, for example, a graphics processor and input and output devices. To more effectively facilitate the transmission of information within the processing system, the CPU is coupled to an information router, such as a north bridge, which determines where to route the information. Typically, the information router, herein after referred to as the north bridge, determines whether the instruction is addressing a location within a graphics based address space, such as an accelerated graphics, a dynamic random access memory (DRAM) address space (i.e. system memory), or an input/output interface address, such as a PCI address space.

One major function of the north bridge is to direct system memory instructions from a system memory. Previously, due to size limitations of the memory devices, the north bridge was disposed on a separate integrated circuit and the system memory consisted of a dual in-line memory module (DIMM) or any other type of memory as recognized by one skilled in the art, such as, but not limited to, SDRAM or RAMBUS, hosting a plurality of memories, such as a DRAM.

In a typical north bridge processing system, if the received physical address corresponds to the AGP address space, the north bridge further translates the physical address, using a GART table, into a corresponding physical address. Having obtained the physical address, the north bridge communicates with the memory to retrieve the appropriate memory block (e.g., line of memory, or multiple lines of memory where a line is 32 bits, 64 bits, 128 bits, etc.). If the physical address corresponds to the memory, the north bridge utilizes the physical address to facilitate the memory transaction. As such, if the memory transaction was a read transaction, the north bridge facilitates the retrieval of the corresponding memory line or lines from memory and provides them to the central processing unit. If the received physical address corresponds with the PCI address space, the north bridge passes the transaction to the PCI bus.

A south bridge, upon receiving a physical address, determines which of the plurality of I/O devices is to receive the transaction. To facilitate the forwarding of transactions to the I/O devices, the south bridge includes a plurality of memories, one for each I/O device coupled thereto, for queuing transactions to and from the corresponding I/O device. If an I/O device has a transaction queued, the south bridge, in a Round Robin manner, divides the PCI bus for transporting the queued transaction to the corresponding I/O device. As such, each I/O device has separate memory and therefore does not provide a dynamic interface.

In addition to the north bridge receiving transactions from the central processing unit, it may also receive transactions from the video graphics processor and the south bridge relaying transactions from I/O devices. Such transactions have varying requirements. For example, transactions from the central processing unit and video graphics processor are typically high-speed transactions which require low latency. The amount of data in such transactions may vary but is generally a memory line or plurality of memory lines per transaction. The transactions from the I/O devices are generally large amounts of data (i.e., significantly more than several memory lines of data), but are typically latency tolerant.

The central processing unit, the north bridge, the video graphics processor, the south bridge, are fabricated as separate integrated circuits. As such, the transmission path from the central processing unit through the north bridge to the memory is of a relatively significant length, in comparison to buses within the integrated circuits. As is known in the art, the length of a physical path impacts the speed at which data may be transmitted. Such restrictions arise due to the inductance and capacitance of such transmission paths. In short, the relatively substantial lengths of these paths limit the bandwidth capabilities and overall speed capabilities of processing transactions.

Within such a system, the memory includes a memory, such as but not limited to, a dynamic random access memory (DRAM), which is accessed via a single memory bus. If the system requires additional parallel memory, the system employs additional DRAMs and an addition memory bus. But with each additional DRAM bus, the north bridge requires an additional memory controller. Moreover, the north bridge would require a larger overall substrate package to accommodate parallel memory channels. For example, if the system includes four DRAM buses, the north bridge includes four memory controllers. In addition, each device coupled to the north bridge needs to know which DRAM it is accessing such that it provides the appropriate address in the read and/or write transaction.

As illustrated in prior art FIG. 1, the north bridge 100 is electrically coupled to the DIMM 102 via a plurality of external connections 104 to a bus 106, wherein the DIMM 102 connects to the bus 106 across a plurality of pin connections (not shown). The DIMM 102 includes a plurality of memories 108, such as RAM or DRAM, connected to the bus 106 for receiving and transmitting system information across the north bridge 100. The north bridge 100 and the DIMM 102 are connected via the external connections 104 and the bus 106, which produce a plurality of complications. For example, during the manufacturing process, there are additional manufacturing steps associated with the external connections. There are also problems of potential interference or corruption of the data transmitted across the connections 104. Moreover, problems arise due to space restrictions within modern computing systems as the DIMM 102 consumes valuable real estate within a computer processing system. And, among other things, having the DIMM 102 externally connected to the north bridge 100 reduces overall system speed as the system information must be transmitted across the external connections 104, thereby increasing processing times and reducing overall system efficiency.

With further developments of memory devices, a previous approach to reducing problems associated with external placement of memory was to place a frame buffer associated with a graphics processor on a north bridge integrated circuit for storing graphics information. This previous approach teaches solely of a graphics memory buffer for interaction with the graphics processor, but does not address complications that arise with respect to system instructions. Moreover, the frame buffer consisted of a memory storage size, in bytes which is wholly inadequate for modern processing requirements, which would render it almost useless for storing system instructions. Moreover, the previous approach would be unable to include adequate system memory without thereupon producing an extremely large integrated circuit, inconsistent with a standard dimension integrated circuit, which would be practically unusable in modern computing systems due to the size of the memory devices at that time.

Therefore, there exists a need for an improved integrated circuit having including at least one system memory integrated with the information router for the improved processing of system information and to provide dual channel bandwidth with a single channel package size.

BRIEF DESCRIPTION OF THE DRAWINGS

The invention will be more readily understood with reference to the following drawings, wherein.

DETAILED DESCRIPTION

Generally, an integrated circuit having memory disposed thereon includes a standard dimension carrier substrate. An information router, such as a north bridge, a south bridge, or any other integrated circuit capable of receiving and routing information between multiple locations, is integrated on the carrier substrate. The integrated circuit further includes system memory also integrated on the carrier substrate. The system memory is within electrical communication with the information router across a plurality of electrical leads associated with the carrier substrate, such as disposed within multiple layers on the substrate or disposed on an outer surface of the substrate. Thus, system instructions may be stored and retrieved from the system memory through the information router, all within the standard dimension carrier substrate.

Figure 1:
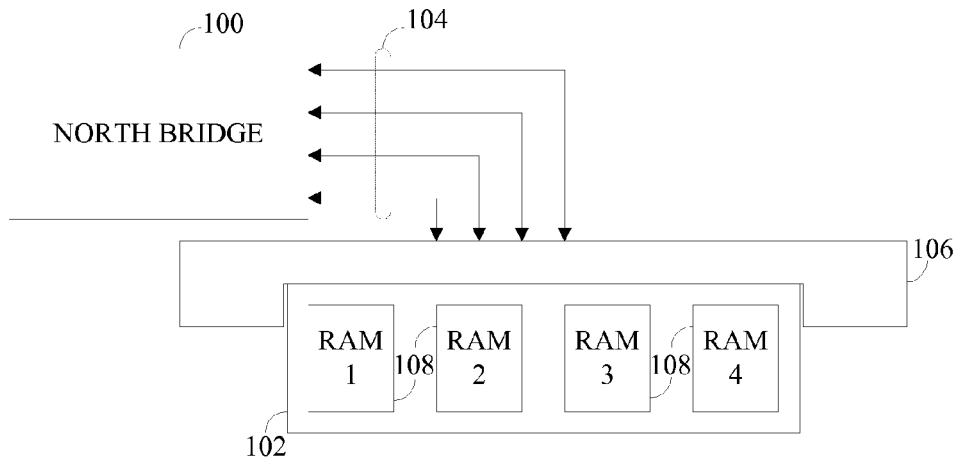
FIG. 1 is a block diagram illustrating a prior art memory and north bridge system.
Figure 2:
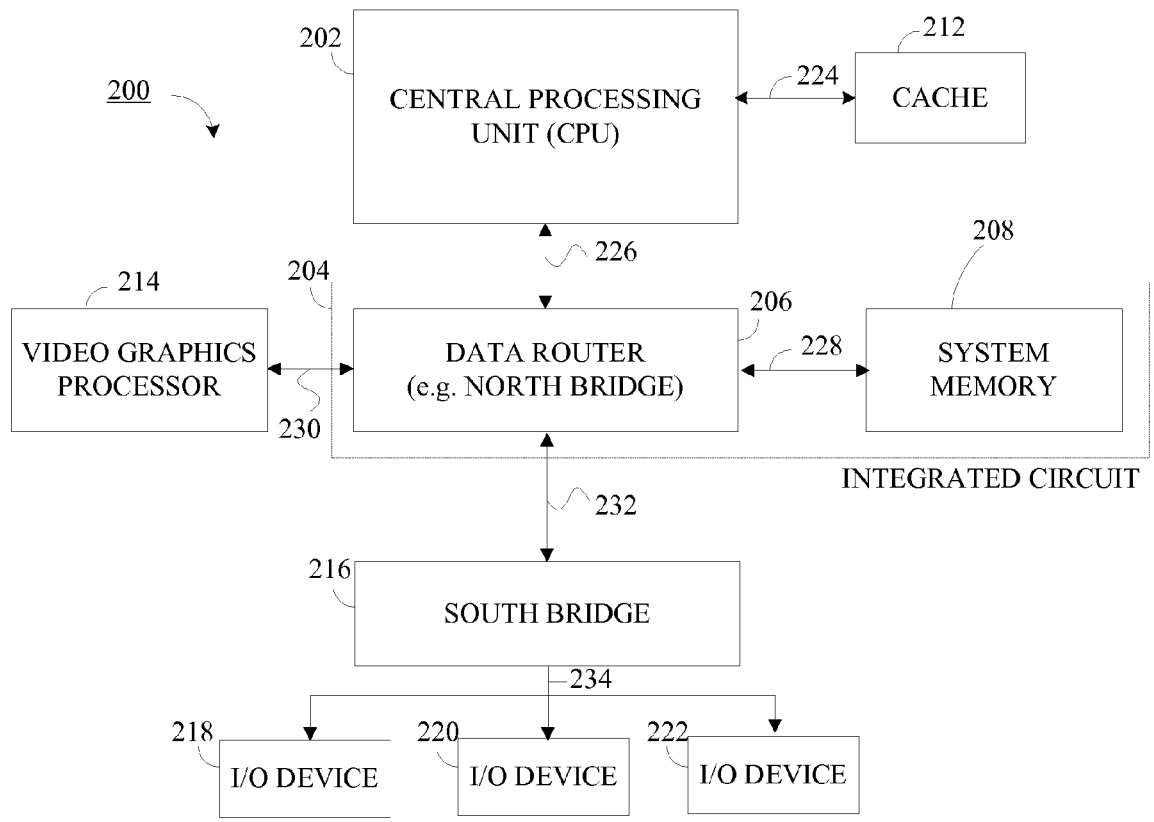
FIG. 2 is a block diagram of a computing system in accordance with one embodiment of the present invention.

More specifically, FIG. 2 illustrates a processing system 200 having a central processing unit (CPU) 202 in communication with an integrated circuit 204 in accordance with one embodiment of the present invention. The integrated circuit 204 includes an information router 206, such as a north bridge, south bridge, or any other integrated circuit capable of receiving and routing data between multiple locations, and a system memory 208 such as a RAM, chip scale package memory (CSP) having a memory die disposed therein, or any other suitable memory device as recognized by one having ordinary skill in the art.

The system 200 further includes a cache 212 coupled to the CPU 202 and a video graphics processor 214 and a south bridge 216 coupled to the integrated circuit 204. Moreover, the system 200 includes a plurality of input/output (I/O) devices 218, 220 and 222 coupled to the south bridge 216.

Typically, the CPU 202 may receive instructions 224 from the cache 202, process the instructions and provide processing instructions 226 to the information router 206. The information router 206 uses known data routing techniques, such as the processing technique of a north bridge utilizing a look aside table to route the processing instructions 226 to the appropriate location. If the processing instructions 226 include storing or retrieving system instructions 228, the information router 204 provides or retrieves the system instructions 228 from the system memory 208 within the same integrated circuit 204. With the information router 206 and the system memory 208 being disposed on the same integrated circuit 204, system instructions 228 are stored or retrieved from the system memory, 208, thereby improving the processing speed of the integrated circuit 204.

In the event the processing instructions 226 include graphics processing instructions 230, the information router may provide these instructions 230 to the video graphics processor 214. Furthermore, if the processing instructions include input or output instructions 232, the information router 204 provides these instructions to the south bridge 216 whereupon the south bridge provides an input or output signal 234 to at least one of the input/output devices 218, 220, and 222.

Figure 3:
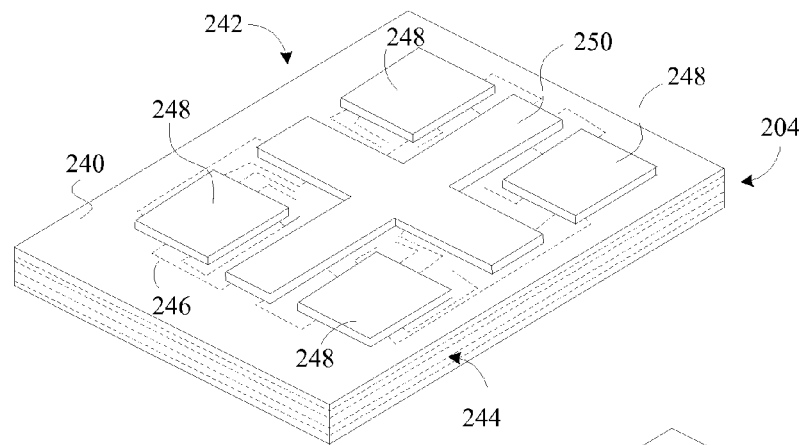
FIG. 3 is a perspective view of a top side of a integrated circuit in accordance with one embodiment of the present invention.

FIG. 3 illustrates a perspective view of one embodiment of the integrated circuit 204. The integrated circuit 204 includes a carrier substrate 240 having a top surface 242. The carrier substrate 240 is composed of Bismaleimide Triazine (BT Laminate) but may also be composed of a ceramic, flex or any other suitable material as recognized by one skilled in the art. Furthermore, the carrier substrate has a standard dimension capable of being readily manufactured and utilized in conjunction with a typical computer system. A standard dimension carrier substrate typically includes a carrier substrate having a dimension of a width between 31 and 41 millimeters and a length between 31 and 41 millimeters, more specifically in the preferred embodiment, the carrier substrate has a dimension of approximately 31 by 31 millimeters or 34 by 34 millimeters. As recognized by one skilled in the art, other dimension carrier substrates may be utilized wherein the standard dimension includes any dimension commercially available and compatible with the space restrictions within a computing system.

Moreover, the carrier substrate 240 may have a plurality of layers 244, wherein each of the layers includes a plurality of electrical leads 246, shown in shadow on the top surface 242. As recognized by one having ordinary skill in the art, the number of layers 244 allows for the placement of varying amounts of electrical leads within the carrier substrate 240. Different carrier substrates 240 having different numbers of layers 244 may be utilized, wherein the carrier substrate 240 provides the electrical coupling of elements attached thereto.

FIG. 3 further illustrates a plurality of chip scale package (CSP) system memories 248 disposed on the top surface 242. The system memories 248 are electrically coupled to corresponding electrical leads within the carrier substrate 240. In one embodiment, the plurality of memories 248 are attached to the electrical leads 246 using a solder technique to produce a plurality of solder joints for conducting electrical communication. As recognized by one skilled in the art, any other connection technique may be utilized to attach the system memories 248 to the electrical leads 246, such as wirebonding. Also illustrated in FIG. 3, the integrated circuit 204 further includes a heat sink 250 attached to the carrier substrate 240 using an epoxy.

Figure 4:
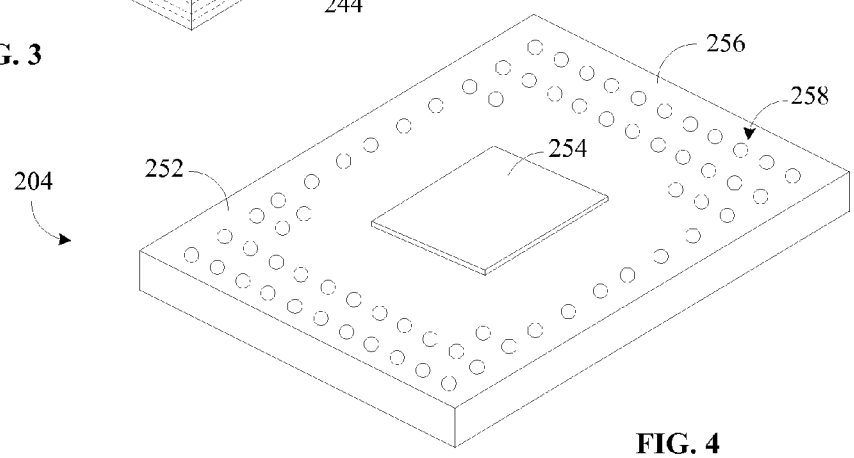
FIG. 4 is a perspective view of a bottom side of the integrated circuit of FIG. 3.

FIG. 4 illustrates, in perspective view, a bottom surface 252 of the integrated circuit having an application specific integrated circuit (ASIC) 254 and a solder ball array 256 composed of a plurality of solder members 258, such as solder balls, disposed thereon. In one embodiment, the application specific integrated circuit 254 is an ASIC die having data routing functionality, such as a north bridge. In one embodiment, the solder ball array is in accordance with copending U.S. patent application entitled SOLDER BALL COLLAPSE CONTROL APPARATUS AND METHOD THEREOF, Ser. No. 10/064,857, and a filing date of Aug. 23, 2002. As recognized by one having ordinary skill in the art, any solder ball array 256 may be disposed on the bottom surface 252 such that the electrical leads (not shown) within the carrier substrate 204 may be in electrical contact with another surface after the solder balls have been melted.

The ASIC 254 is in electrical communication with the plurality of memories 248 of FIG. 3 through the electrical leads 246, whereupon system instructions (228 of FIG. 2) may be stored and retrieved from the system memory 248 through the ASIC 254.

Figure 5:
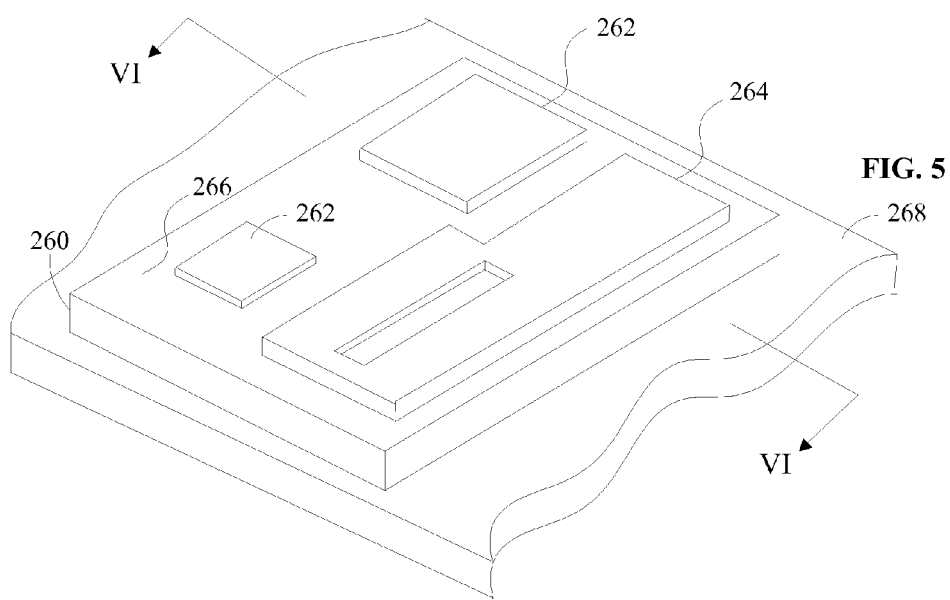
FIG. 5 is a perspective view of an alternative embodiment of the top side of the integrated circuit in relation to a printed circuit board.

FIG. 5 illustrates another embodiment of the present invention having a carrier substrate 260 having a plurality of system memories 262 and a heat sink 264 disposed on a top surface 266. The carrier substrate 260 is disposed on top of a printed circuit board 268. Furthermore, in one embodiment, the bottom surface of carrier substrate (not visible) is illustrated by FIG. 4, having the ASIC 254 and the solder ball array 256 disposed thereon.

The printed circuit board 268 includes a plurality of electrical contacts such that when a heat is applied to the combination of the printed circuit board 268 and the carrier substrate 260, the solder ball array creates a plurality of solder joints that allow electrical communication therebetween.

Figure 6:
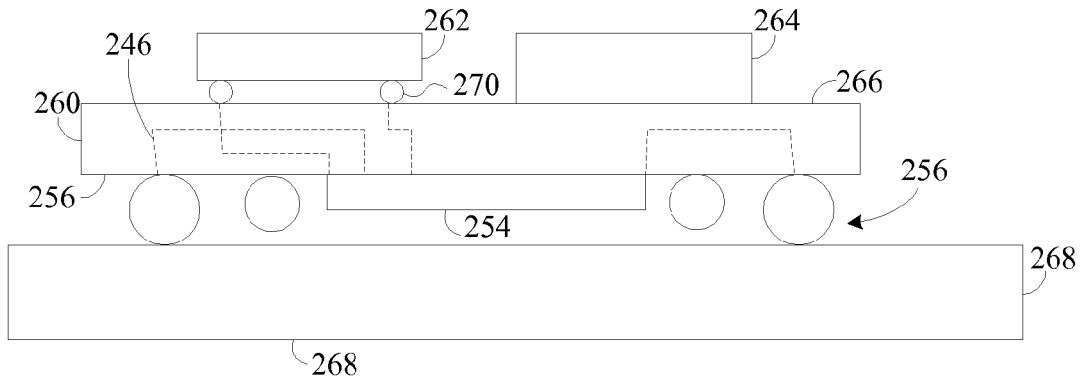
FIG. 6 is a cross-sectional view of FIG. 5 across line V-V.

To provide further clarification, FIG. 6 illustrates a cross-sectional view of the carrier substrate 260 and the printed circuit board along the cross-section VI-VI. As illustrated, in one embodiment the ASIC 256 is disposed on and extending out from the bottom surface 252. The solder ball array 256 engages the printed circuit board 268, and is thereupon electrically coupled through a plurality of solder joints formed by the solder balls 258 of the solder ball array 256.

Moreover, FIG. 6 illustrates the system CSP memory 262 affixable to the top surface 240 of the carrier substrate using a plurality of solder balls 270. Similar to the solder ball array 256 on the bottom surface 252, the solder balls 270 provide for a plurality of solder joints between the CSP system memory 262 and the carrier substrate 260, more specifically to the electrical leads 246 within the carrier substrate 260.

Further illustrated in the cross-sectional view of FIG. 6 is the connection of the ASIC 254 to the carrier substrate 260. In one embodiment, the ASIC is an ASIC die that is connected to the carrier substrate 260, more specifically to the electrical leads 246, using known flip chip technology. Thereupon, electrical communication occurs between the system memories 262 and the ASIC 254 across the electrical leads 246, within the same integrated circuit 204.

Figure 7A:
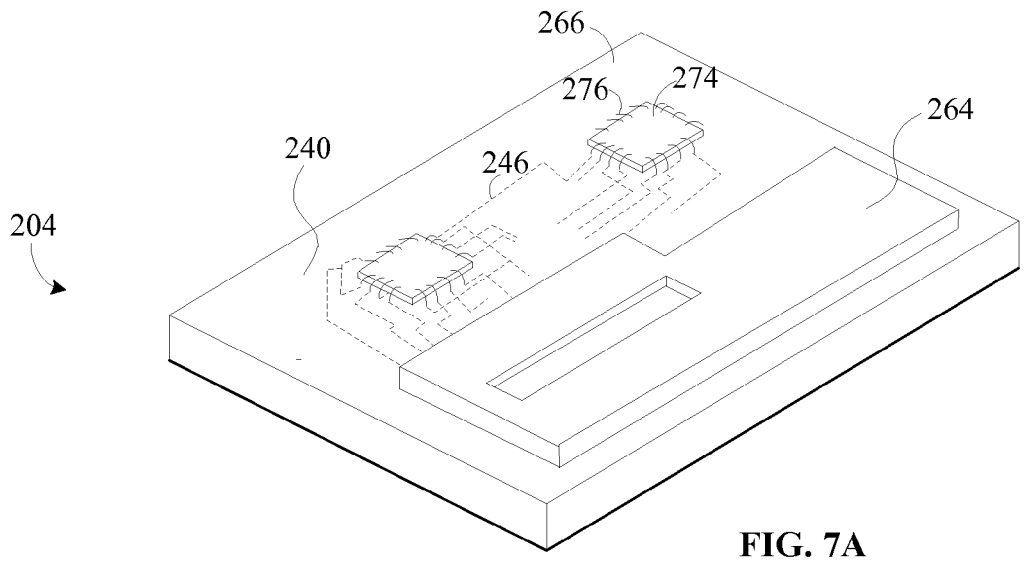
FIG. 7a is a perspective view of an alternative embodiment of the top side of the integrated circuit.

FIG. 7a illustrates another embodiment of the integrated circuit 204 of the present invention wherein the system memories 274 are memory dies attached to the carrier substrate 260 using a plurality of wirebonds 276. More specifically, the memory dies are attached to the electrical leads 246 which are coupled to the ASIC (not visible in FIG. 7a) disposed on the bottom surface 252 of the carrier substrate 260. Further illustrated in FIG. 7a is the heat sink 264 on the top surface, which provides protection for the ASIC 254 and the system memories 274 when heat is applied to melt the solder ball array in accordance with known heat sink operations.

Figure 7B:
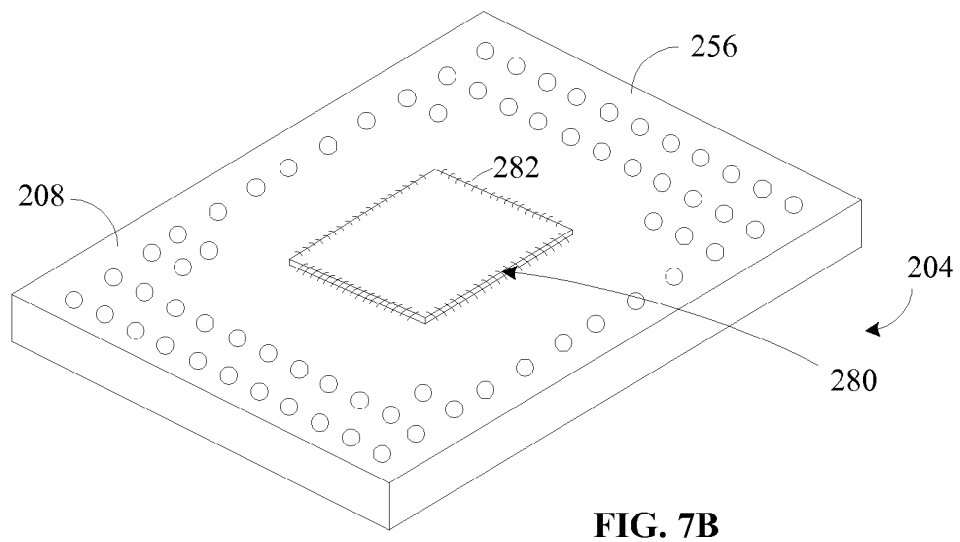
FIG. 7b is a perspective view of an alternative embodiment of the bottom side of the integrated circuit.

FIG. 7b illustrates another embodiment of the integrated circuit 204 of the present invention wherein the data router is an ASIC die 280 coupled to the bottom surface 252 of the carrier substrate 260 using a plurality of wirebonds 282. Similar to the embodiment of FIG. 7a, the wirebonds 282 provide electrical communication between the ASIC die 280 and the memories, not visible, disposed on the top surface of the carrier substrate 260.

Figure 8:
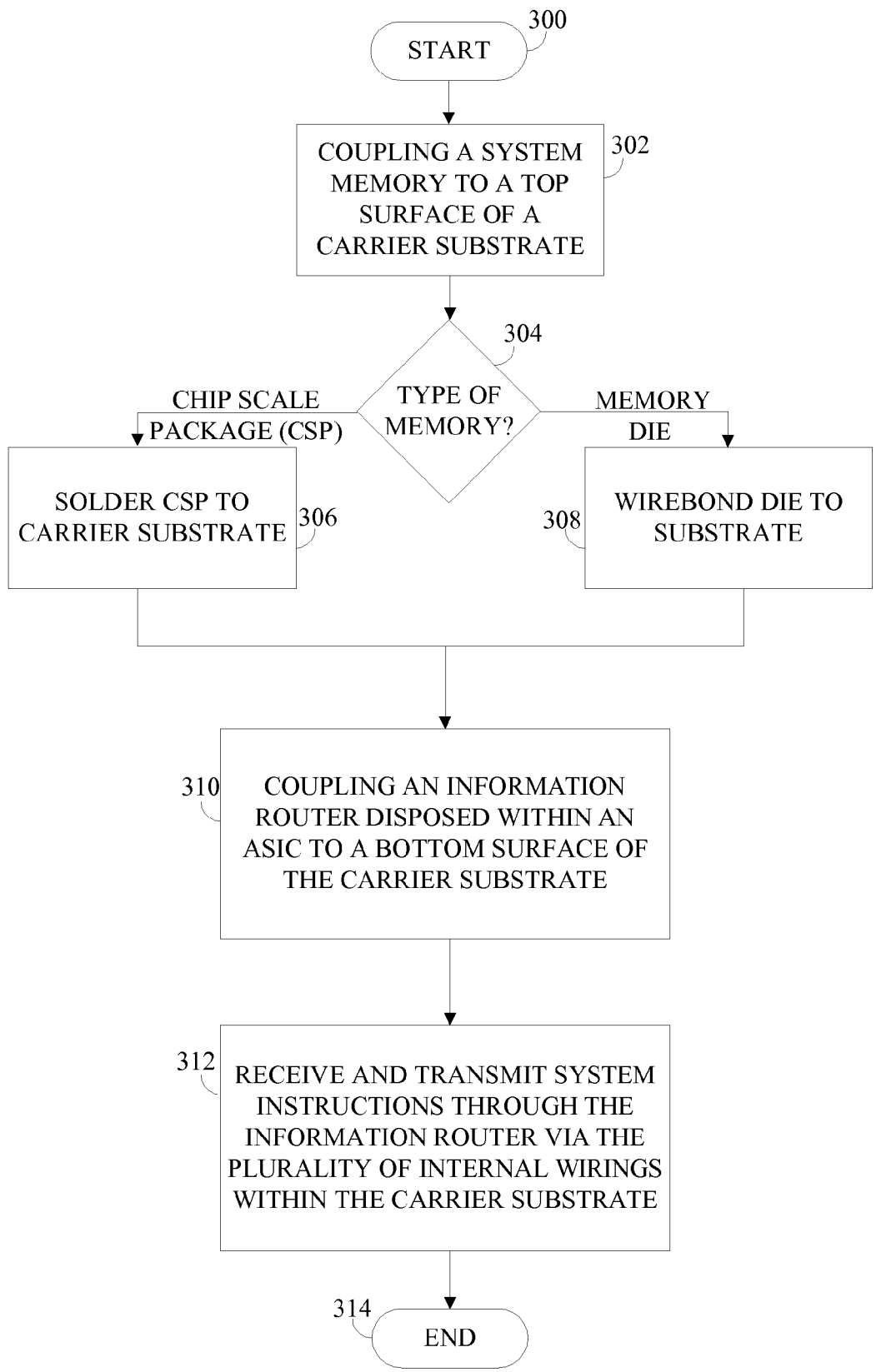
FIG. 8 is a flowchart illustrating the step for making the integrated circuit in accordance with one embodiment of the present invention.

FIG. 8 illustrates the steps of a method for making the integrated circuit 204 in accordance with one embodiment of the present invention. The method begins 300 by coupling system memory 248 or 274 to the top surface 242 of the carrier substrate 240, designated at step 302. Depending on the type of system memory used, such as either the CSP memory 248 or the memory die 274, the system memory is coupled to the carrier substrate differently, step 304. If the system memory is CSP memory 248, the system memory 248 may be soldered to the carrier substrate 260, step 306. In another embodiment, if the memory is the memory die 274, the memory die 274 is attached using a plurality of wirebonds 276, step 308. More specifically, when the system memory 248 or 274 is attached to the carrier substrate 260, the memory 248 or 274 is attached to the plurality of electrical leads 246 associated with the carrier substrate 260.

Once the system memory, such as 248 or 274, is attached to the carrier substrate 260, the ASIC having an information router therein is coupled to the bottom surface 252 of the carrier substrate 260, step 310. In the embodiment where the ASIC includes an ASIC die having a north bridge disposed therein, the ASIC die is coupled to the bottom surface 252 using a plurality of wirebonds. More specifically, the ASIC is coupled to the electrical leads 246 associated with the carrier substrate.

Thereupon, step 312, the system memory 248 or 274 may receive and transmit system instructions through the information router across the plurality of electrical leads associated with the carrier substrate. Thus the integrated circuit includes an information router ASIC and a system memory integrated thereon, step 314.

Figure 9:
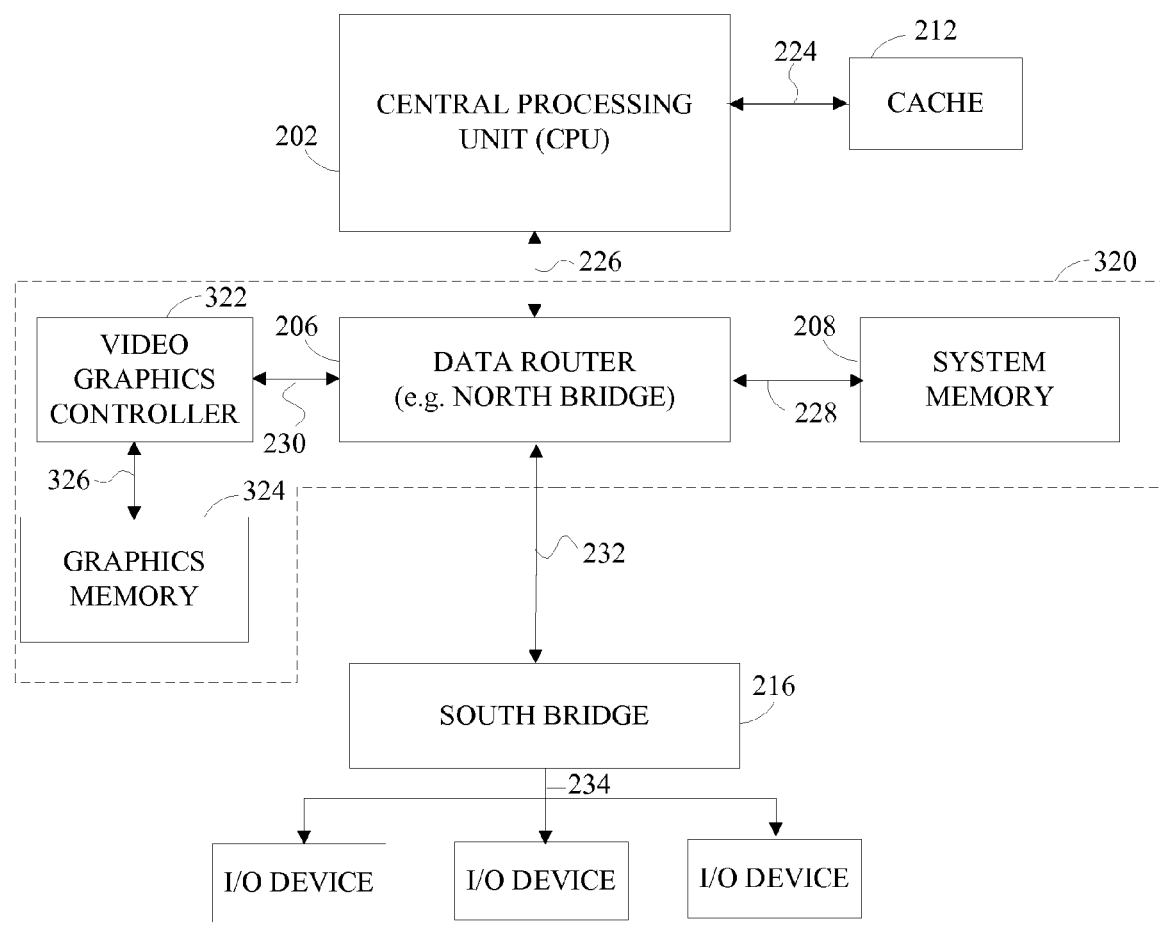
FIG. 9 is a block diagram of a computer processing system in accordance with another embodiment of the present invention.

FIG. 9 illustrates, in block diagram form, another embodiment of the present invention wherein an integrated circuit 320 coupled to the CPU 202 and the south bridge 216 includes the information router 206, the system memory 208, a graphics controller 322 and a graphics memory 324, providing graphics information 326 therebetween. Similar to the embodiment described above with respect to FIG. 2, the CPU 202 receives instructions 224 from the cache 212 and provides processing instructions to the integrated circuit 320. Although, the integrated circuit 320 provides for the graphics controller 322 to be disposed within the ASIC containing the information router. Furthermore, the integrated circuit contains either more memory for the graphics memory 324 or a portion of the system memory 208 is utilized by the graphics memory 324 to store graphics information.

For example, with reference to FIGS. 3 and 4, in another embodiment, the ASIC 254 may further include the graphics controller 322 as well as the information router 206. One of the memories 248 (or 274 of FIG. 7) may be designated as a graphics memory to receive and store the graphics information. Although, the integrated circuit maintains the system memory for the information router within the ASIC, in electrical communication across the electrical leads 246 associated with the carrier substrate 260.

It should be understood that the limitations of other variations and modifications of the invention in its various aspects as may be readily apparent to those of ordinary skill in the art, and that the invention is not limited by the specific embodiments described herein. For example, the ASIC die may contain further integrated circuits for further functionality and the memories disposed on the carrier substrate may provide for storage and retrieval of more than system information and graphics information. It is therefore contemplated to cover by the present invention any and all modifications, variations or equivalents that fall within the spirit and scope of the basic underlying principles disclosed and claimed herein.

What is claimed is:

1. A method for making an integrated circuit comprising:
   coupling a system memory to a top surface of a standard dimension carrier substrate having a plurality of internal wirings disposed within a carrier substrate; and
   coupling a north bridge to a bottom surface of the carrier substrate wherein the system memory is operative to at least one of receive and transmit system instructions through the north bridge via the plurality of internal wirings disposed within the carrier substrate.

2. The method of claim 1, wherein when the system memory is composed of a chip scale package memory having a plurality of contact pins, the coupling of the system memory to the top surface of the carrier substrate includes soldering the plurality of contact pins to one or more of the plurality of the internal wirings disposed within the carrier substrate; and wherein when the system memory is composed of at least one memory die, the coupling of the system memory on the top surface of the carrier substrate includes wirebonding the at least one memory die to the one or more of the plurality of the internal wirings disposed within the carrier substrate.

3. The method of claim 1, wherein the north bridge is disposed within an application specific integrated circuit and the coupling of the north bridge on the bottom surface of the carrier substrate includes wirebonding the application specific integrated circuit die to one or more of the plurality of the internal wirings disposed within the carrier substrate.

4. The method of claim 3, wherein the application specific integrated circuit die further includes a graphics processor in conjunction with the north bridge.

5. An integrated circuit formed by a method comprising:
   coupling a system memory to a top surface of a standard dimension carrier substrate having a plurality of internal wirings disposed within a carrier substrate; and
   coupling a north bridge to a bottom surface of the carrier substrate wherein the system memory is operative to at least one of receive and transmit system instructions through the north bridge via the plurality of internal wirings disposed within the carrier substrate.

6. The integrated circuit of claim 5, wherein when the system memory is composed of a chip scale package memory having a plurality of contact pins, the coupling of the system memory to the top surface of the carrier substrate includes soldering the plurality of contact pins to one or more of the plurality of the internal wirings disposed within the carrier substrate; and wherein when the system memory is composed of at least one memory die, the coupling of the system memory on the top surface of the carrier substrate includes wirebonding the at least one memory die to the one or more of the plurality of the internal wirings disposed within the carrier substrate.

7. The integrated circuit of claim 5, wherein the north bridge is disposed within an application specific integrated circuit and the coupling of the north bridge on the bottom surface of the carrier substrate includes wirebonding the application specific integrated circuit die to one or more of the plurality of the internal wirings disposed within the carrier substrate.

8. The integrated circuit of claim 7, wherein the application specific integrated circuit die further includes a graphics processor in conjunction with the north bridge.

9. A method for making an integrated circuit comprising:
   coupling a system memory and a frame buffer to a top surface of a standard dimension carrier substrate having a plurality of internal wirings disposed within a carrier substrate; and
   coupling at least one of a north bridge and a south bridge to a bottom surface of the carrier substrate wherein the system memory is operative to at least one of receive and transmit system instructions through the at least one of the north bridge and the south bridge via the plurality of internal wirings disposed within the carrier substrate; and wherein the frame buffer is operative to at least one of receive and transmit graphics processing instructions through the at least one of the north bridge and the south bridge via the plurality of internal wirings disposed within the carrier substrate.

10. An integrated circuit formed by a method comprising:
    coupling a system memory and a frame buffer to a top surface of a standard dimension carrier substrate having a plurality of internal wirings disposed within a carrier substrate; and
    coupling at least one of a north bridge and a south bridge to a bottom surface of the carrier substrate wherein the system memory is operative to at least one of receive and transmit system instructions through the at least one of the north bridge and the south bridge via the plurality of internal wirings disposed within the carrier substrate; and wherein the frame buffer may receive and transmit graphics processing instructions through the at least one of the north bridge and the south bridge via the plurality of internal wirings disposed within the carrier substrate.

11. An integrated circuit comprising:
    a standard dimension carrier substrate;
    an application specific integrated circuit die integrated on the carrier substrate wherein an information router is disposed within the application specific integrated circuit die;
    system memory operative to store at least one of system instructions and system information also integrated on the carrier substrate and in electrical communication with the information router via at least one of a plurality of electrical leads directly connected to the carrier substrate, wherein the at least one of system instructions and system information is at least one of stored and retrieved from the system memory through the information router; and
    wherein the information router is operative to route the at least one of system instructions and the system information between a processor external to the standard dimension carrier via an external processor bus and the system memory.

12. The integrated circuit of claim 11, wherein the information router is operative to provide the functionality of at least one of a north bridge and a south bridge.

13. The integrated circuit of claim 12, wherein the application specific integrated circuit die in which the information router is disposed is a single application specific integrated circuit die.

14. The integrated circuit of claim 11, wherein the system memory comprises one of a chip scale package and a memory die, and wherein the system memory is coupled to the at least one of the plurality of electrical leads using at least one of a plurality of solder members arranged in a solder ball array and a plurality of wirebonds.

15. The integrated circuit of claim 11, further comprising a frame buffer integrated on the carrier substrate and in electrical communication with the information router via at least one of a second plurality of electrical leads directly connected to the carrier substrate, wherein the frame buffer is operative to store graphics information.

16. The integrated circuit of claim 15, wherein the frame buffer comprises one of a chip scale package and a memory die; and wherein the frame buffer is coupled to the at least one of the second plurality of electrical leads using one of a plurality of solder members arranged in a solder ball array and a plurality of wirebonds.

17. The integrated circuit of claim 11, wherein a graphics controller is disposed within the application specific integrated circuit.

18. The integrated circuit of claim 17, wherein the information router is further operative to route graphics processing instructions to the graphics controller.

19. The integrated circuit of claim 11, wherein the carrier substrate is composed of at least one of Bismaleimide Triazine, ceramic, and flex.

20. The integrated circuit of claim 11, wherein the information router is operative to route the at least one of system instructions and system information using a look aside table.

21. A processing system comprising:
a central processing unit;
a carrier substrate;
an application specific integrated circuit die integrated on the carrier substrate wherein an information router is disposed within the application specific integrated circuit die;
system memory operative to store at least one of system instructions and system information also integrated on the carrier substrate and in electrical communication with the information router via at least one of a plurality of electrical leads directly connected to the carrier substrate, wherein the at least one of system instructions and system information is at least one of stored and retrieved from the system memory through the information router; and
wherein the information router is operative to route the at least one of system instructions and the system information between the central processing unit external to the standard dimension carrier via an external processor bus and the system memory.

* * * * *